(12) United States Patent
Nakano et al.

(10) Patent No.: US 6,416,578 B1
(45) Date of Patent: Jul. 9, 2002

(54) SILICON CARBIDE FILM AND METHOD FOR MANUFACTURING THE SAME

(75) Inventors: Yukitaka Nakano; Hiroyuki Nagasawa; Kuniaki Yagi; Takamitsu Kawahara, all of Tokyo (JP)

(73) Assignee: Hoya Corporation (JP)

( * ) Notice: Subject to any disclaimer, the term of this patent is extended or adjusted under 35 U.S.C. 154(b) by 0 days.

(21) Appl. No.: 09/515,134

(22) Filed: Feb. 29, 2000

(51) Int. Cl.$^7$ .............................................. C30B 25/02
(52) U.S. Cl. ........................ 117/94; 117/97; 117/101; 117/106; 117/951
(58) Field of Search ............................ 117/94, 97, 101, 117/106, 951

(56) References Cited

U.S. PATENT DOCUMENTS 5,248,385 A * 9/1993 Powell ........................ 438/507
5,501,173 A    3/1996 Burk, Jr. et al.

FOREIGN PATENT DOCUMENTS

| EP | 0 020 134 A | 12/1980 |
| JP | 63270398 | 11/1988 |
| JP | 6-041400 | 2/1994 |

OTHER PUBLICATIONS

Shibahara et al., "Antiphase–domain–free Growth of Cubic SiC on Si(100)", Applied Physics Letters, U.S. American Institute of Physics, vol. 50, No. 26, pp. 1888–1890, Jun. 29, 1987.

Shigeta, et al., "Chemical Vapor Deposition of Single–Crystal Films of Cubic SiC On Patterned SI Substrates," Applied Physics Letters, U.S. American Institute of Physics, New York, vol. 55, No. 15, pp. 1522–1524, Oct. 9, 1989.

* cited by examiner

*Primary Examiner*—Felisa Hiteshew
(74) *Attorney, Agent, or Firm*—Cook, Alex, McFarron, Manzo, Cummings & Mehler, Ltd.

(57) ABSTRACT

There is disclosed a method for manufacturing a silicon carbide film in which a crystal orientation continued on a single crystal substrate surface and silicon carbide is allowed to epitaxially grow, the method comprising the steps of: entirely or partially providing the substrate surface with a plurality of undulations extended parallel in one direction; and allowing silicon carbide to grow on the substrate surface.

9 Claims, 4 Drawing Sheets

SILICON CARBIDE FILM AND METHOD FOR MANUFACTURING THE SAME

BACKGROUND OF THE INVENTION (i) Field of the Invention

The present invention relates to a single crystal silicon carbide film as an electronic material, particularly to silicon carbide which is preferable in preparing a semiconductor device and which has a low defect density and to a method for manufacturing the silicon carbide.

(ii) Description of the Related Art

The growth of silicon carbide (SiC) has heretofore been classified to a bulk growth by a sublimation process, and a thin film formation by epitaxial growth onto a substrate.

In the bulk growth by the sublimation process the growth of 6H—SiC or 4H—SiC which is a polytypism with a high temperature phase is possible, and the preparation of SiC itself as the substrate has been realized. However, there are a large number of defects (micro pipes) introduced into a crystal, and it has been difficult to enlarge a substrate area.

On the other hand, when the epitaxial growth process onto a single crystal substrate is used, the enhancement of controllability of impurity addition or the enlargement of substrate area, and the reduction of micro pipes having caused problems in the sublimation process are realized. In the epitaxial growth process, however, the increase of a plane defect density by a difference in lattice constant between a substrate material and a silicon carbide film often raises a problem. Particularly, since Si usually used as the substrate to grow has a large lattice mismatching from SiC, twins and anti phase boundaries (APB) are remarkably generated in an SiC growth layer, and these deteriorate the properties of SiC as an electronic element.

As a method of reducing surface defects in the SiC film, for example, a technique of reducing the surface defects having inherent or more thickness is proposed in Japanese Patent Publication No. 41400/1994, which includes a process of disposing a growth area on a substrate to grow, and a process of allowing a silicon carbide single crystal to grow in this growth area so that its thickness becomes the same as or more than the thickness inherent to the growth surface orientation of the substrate. However, since two orientations of anti phase boundaries contained in SiC have properties to be enlarged in directions orthogonal to each other with respect to the increase of SiC film thickness, the anti phase boundaries cannot effectively be reduced. Furthermore, the direction of a super structure formed on the grown SiC surface cannot arbitrarily be controlled. Therefore, for example, when the separated growth areas are combined with each other according to the growth, the anti phase boundary is newly formed on this combined part, which deteriorates electric properties.

As a method of effectively reducing the anti phase boundaries, K. Shibahara et al. have proposed a growth process onto an Si (100) surface substrate in which a surface normal axis is slightly inclined to [110] from [001] direction (an off angle is introduced) (Upright Physics Letter, vol. 50, 1987, page 1888). In this method, since an atomic level step is introduced at equal intervals in one direction by applying the slight inclination to the substrate, the surface defect having a direction parallel to the introduced step is propagated. On the other hand, the propagation of the surface defect to the direction vertical to the introduced step (a direction across the step) is effectively suppressed. Therefore, since the anti phase boundary enlarged in the direction parallel to the introduced step is enlarged in preference to the anti phase boundary enlarged in the orthogonal direction in the two orientations of anti phase boundaries included in the film with respect to the film thickness increase of silicon carbide, the anti phase boundaries can effectively be reduced. However, as shown in FIG. 1, in this method, the increase of step density of an SiC/Si interface causes the generation of an undesired anti phase boundary 1, and there is a problem that the anti phase boundary cannot completely be eliminated. Additionally, in FIG. 1, numeral 1 denotes an anti phase boundary generated in the single atom step of Si substrate, 2 denotes an anti phase boundary association point, 3 denotes an anti phase boundary generated in an Si substrate surface terrace, θ denotes an off angle, and φ denotes an angle (54.7°) formed between the Si (001) surface and the anti phase boundary. The anti phase boundary 3 generated in the Si substrate surface terrace disappears in the anti phase boundary association point 2, but the anti phase boundary 1 generated in the single atom step of the Si substrate has no other boundary to associate, and does not disappear,

SUMMARY OF THE INVENTION

The present invention has been developed under the above-described background, and an object thereof is to provide a silicon carbide film in which anti phase boundaries are effectively reduced or eliminated.

To attain the above-described object, the present invention provides the following constitutions.

(Constitution 1) A method for manufacturing a silicon carbide film in which a crystal orientation is inherited on a single crystal substrate surface and silicon carbide is allowed to epitaxially grow, the method for manufacturing the silicon carbide film comprising the steps of: entirely or partially providing the substrate surface with a plurality of undulations extended parallel in one direction; and allowing silicon carbide to grow on the substrate surface.

(Constitution 2) The method for manufacturing the silicon carbide film in the constitution 1 in which during the growth of the silicon carbide film, an epitaxial growth mechanism is used so that a propagation orientation of a surface defect generated in the film can be limited in a specified crystal surface.

(Constitution 3) The method for manufacturing the silicon carbide film described in the constitution 1 or 2 in which when an average value of an interval between undulation tops of the substrate surface is set to W, the silicon carbide film has a thickness of $W/\sqrt{2}(=2^{1/2})$ or more.

(Constitution 4) The method for manufacturing the silicon carbide film described in the constitutions 1 to 3 in which the interval between the undulation tops of the substrate surface is in a range of 0.01 µm to 10 µm, an undulation height difference is in a range of 0.01 µm to 20 µm, and the inclination degree of an inclined surface in the undulation is in a range of 1° to 55°.

(Constitution 5) The method for manufacturing the silicon carbide film described in the constitutions 1 to 4 in which the substrate comprises a singles crystal Si, the substrate surface comprises a (001) surface, and the surface is provided with the undulation extended in parallel with a [110] orientation.

(Constitution 6) The method for manufacturing the silicon carbide film described in the constitutions 1 to 4 in which the substrate comprises a single crystal 3C—SiC, the substrate surface comprises a (001) surface, and the surface is provided with the undulation extended in parallel with a [110] orientation.

(Constitution 7) The method for manufacturing the silicon carbide film described in the constitutions 1 to 4 in which the substrate comprises a hexagonal single crystal SiC, the substrate surface comprises a (1, 1, −2, 0) surface, and the surface is provided with the undulation extended in parallel with a [1, −1, 0, 0] orientation or a [0, 0, 0, 1] orientation.

(Constitution 8) A silicon carbide film manufactured using the method described in the constitutions 1 to 7.

(Constitution 9) The silicon carbide film which comprises a step of a plurality of undulations entirely or partially formed on a single crystal substrate surface and extended parallel in one direction, and which has a structure subjected to epitaxial growth in a method so that a propagation orientation of a film inner surface defect can be limited in a specified crystal surface.

According to the constitution 1, by providing the surface of the substrate to grow of silicon carbide with a plurality of undulations extended parallel in one direction, the effect of introducing the off angle proposed by K. Shibahara et al. can be obtained in the inclined surface of each undulation. Furthermore, in the present invention, since the steps oriented in a Plane symmetrical orientation are introduced to the surface of the substrate to grow of silicon carbide with a statistically balanced density, the anti phase boundaries in the undesirably introduced silicon carbide layer, which generated by the steps on the surface of the substrate, are effectively annihilated, and the silicon carbide film in which the anti phase boundaries are completely eliminated can be obtained. Moreover, in the present invention, the individual growth areas form the same phase area enlarged in the same direction by the off angle introducing effect. Therefore, even when the separated growth areas are combined with one another according to the growth, there is an advantage that no anti phase boundary is produced in the combined part.

Additionally, the undulation mentioned in the present invention does not require a parallel property or a mirror surface symmetrical relation in a mathematically strict meaning, and may have a configuration enough to effectively reduce or eliminate the anti phase boundaries.

Examples of the method of forming an undulation shape on the substrate to grow include a photolithography technique, a press processing technique, a laser processing or ultrasonic processing technique, an abrasion processing technique, and the like. Even when any of the methods is used, the final configuration of the surface of the substrate to grow may have a sufficient configuration to such an extent that the anti phase boundaries can effectively be reduced or eliminated.

When the photolithography technique is used, the arbitrary undulation shape can be transferred to the substrate to grow by arbitrarily forming a mask pattern to be transferred to the substrate. The width of the undulation shape can be controlled, for example, by changing a pattern linear width. Moreover, the depth of the undulation shape or the angle of the inclined surface can be controlled by controlling the etching selection ratio of resist and substrate. Even when a rectangular pattern shape is not required, the undulation pattern with an undulatory shape can be formed by performing a thermal treatment to soften the resist after transferring the pattern to the resist.

When the press processing technique is used, an arbitrary undulation shape can be formed onto the substrate to grow by arbitrarily forming a pressing mold. The undulation with various shapes can be formed on the substrate to grow by forming various shapes of molds.

When the laser or ultrasonic processing technique is used, the undulation shape is directly processed/formed on the substrate, which enables a fine processing.

When the abrasion processing is used, the width or depth of the undulation shape can be controlled by changing the magnitude of abrasive grain diameter or the processing pressure during the abrasion. When the substrate provided with the one-direction undulation shape i,i prepared, the abrasion is performed only in one direction.

According to the constitution 2, the effect of the constitution 1 can securely and sufficiently be obtained by performing the epitaxial growth under the growth condition so that the propagation orientation of the film inner surface defect can be limited in the specified crystal surface. For example, a step flow growth can satisfy this growth condition.

According to the constitution 3, when the average value of the interval between the undulation tops of the surface of the substrate to grow of silicon carbide is set to W, the silicon carbide film has a thickness of $W/\sqrt{2}(=2^{1/2})$. At this time, all the anti phase boundaries disappear. Therefore, it is preferable to set the thickness of the silicon carbide film to $W/\sqrt{2}(=2^{1/2})$ or more.

Additionally, to obtain the effect of the present invention with a thin film thickness, the interval between the undulation tops is preferably narrower.

In the constitution 4, the internal of the undulation tops, the undulation height difference, and the inclination degree of the undulation are defined.

The interval of the undulation tops is preferably 0.01 $\mu$m or more from the standpoint of the limitation of the fine processing technique in the preparation of the undulation to the substrate to grow. Moreover, when the interval of the undulation tops exceeds 10 $\mu$m, the frequency of the association of the anti phase boundaries is excessively lowered. Therefore, the interval of the undulation tops is preferably 10 $\mu$m or less. When the undulation top interval is more preferably in a range of 0.1 $\mu$m to 3 $\mu$m, the effect of the present invention is sufficiently fulfilled.

The height difference and interval of the undulation influence the undulation inclination degree, that is, the step density. Since a preferable step density changes with the crystal growth conditions, this cannot absolutely be said, but the usually necessary undulation height difference has substantially the same degree as the undulation top interval, that is, a range of 0.01 $\mu$m to 20 $\mu$m.

The effect of the present invention is fulfilled by promoting the growth of silicon carbide in the vicinity of the atomic level step in the surface of the substrate to grow. Therefore, the present invention is realized when the undulation inclination degree is in an inclination of 54.70° or less of the (111) surface in which the entire inclined surface is covered with the single step. Moreover, since the undulation inclined surface step density remarkably decreases in the inclination degree less than 1°, the inclination degree of the undulation inclined surface is preferably 1° or more. When the inclination angle of the inclined surface of the undulation is more preferably in a range of 2° to 10°, the effect of the present invention is sufficiently fulfilled.

Additionally, the "undulation inclined surface" mentioned in the present invention includes various configurations such as a flat plane and a curved plane. Moreover, the "inclination degree of the inclined surface in the undulation" means the substantial inclination degree of the inclined surface which contribute to the effect of the present invention, and the maximum inclination degree, average inclination degree, and the like can be employed as the "inclination degree of the undulation" in accordance with the configuration of the inclined surface.

In the constitutions 5 to 7, the surface orientation of the surface of the substrate to grow of silicon carbide, and the undulation orientation are defined.

When the single crystal Si (001) surface or the cubic silicon carbide (001) surface of the single crystal is used as the surface orientation of the surface of the substrate to grow on which the cubic or hexagonal silicon carbide is allowed to grow, the propagation direction of the anti phase boundary is [110]. Therefore, as shown in FIG. 2, by arranging the undulation of the surface in parallel with any one of the directions ([1, −1, 0] direction in FIG. 2), the silicon carbide film can be obtained in which the anti phase boundaries are effectively eliminated on the axis orthogonal to the undulation shown in FIG. 3 (Constitutions 5, 6). Additionally, in FIG. 3, character W denotes the undulation top interval.

When the hexagonal SiC (1, 1, −2, 0) surface of the single crystal is used as the surface orientation of the surface of the substrate to grow on which the cubic or hexagonal silicon carbide is allowed to grow, the propagation direction of the anti phase boundary is [1, −1, 0, 0], [−1, 1, 0, 0], [0, 0, 0, 1], [0, 0, 0, −1]. Therefore, by arranging the undulation of the surface in parallel with any one of the directions, the silicon carbide film can be obtained in which the anti phase boundaries are effectively eliminated as described above (Constitution 7).

According to the constitution 8, by using the method described in the constitutions 1 to 7, the silicon carbide film can be obtained in which the anti phase boundaries are effectively reduced or eliminated.

The silicon carbide film of the present invention has a very superior electric property due to a low crystal boundary density, and can preferably be used as electronic elements such as a semiconductor substrate and a crystal growing substrate (including a seed crystal).

According to the constitution 9, by using the substrate structure and crystal growing method, the silicon carbide film can be obtained in which the anti phase boundaries are effectively reduced or eliminated.

DETAILED DESCRIPTION OF THE PREFERRED EMBODIMENTS

The present invention will more concretely be described hereinafter based on examples.

Comparative Example

First, to confirm the effect by the introduction of the off angle, an Si (001) surface with no off angle, and Si (001) surfaces with off angles of 4° and 10° were prepared as the substrates to grow, and the growing of SiC (3C—SiC) was performed. The growing of SiC is divided to a process of carbonizing the substrate surface, and an SiC growing process by alternate supply of source gas. In the carbonizing process, the processed substrate was heated in an acetylene atmosphere to 1050° C. from a room temperature for 120 minutes. After the carbonizing process, the substrate surface was alternately exposed to dichlorosilane and acetylene in 1050° C., and the growing of SiC was carried out. The detailed conditions of the carbonizing process are shown in Table 1, and the detailed conditions of the SiC growing process are shown in Table 2.

TABLE 1

| | |
|---|---|
| Carbonizing temperature | 1050° C. |
| Acetylene introducing temperature | 24° C. |
| Acetylene flow rate | 10 sccm |
| Pressure | 20 mTorr |
| Temperature rise time | 120 minutes |

TABLE 2

| | |
|---|---|
| Growing temperature | 1050° C. |
| Gas supply method | Alternate supply of acetylene and dichlorosilane |
| Acetylene flow rate | 10 sccm |
| Dichlorosilane flow rate | 10 sccm |
| Gas supply interval | 5 sec |
| Gas supply time | 10 sec |
| Maximum pressure | 100 mTorr |
| Minimum pressure | 10 mTorr |
| No. of gas supply cycles | 50000 times |
| SiC film thickness | 4.5 μm to 5.9 μm |

When the density of the anti phase boundary was measured with respect to the SiC developed on each substrate, results shown in Table 3 were obtained.

Additionally, the density of the anti phase boundary was obtained by AFM observation of the silicon carbide surface. In this case, after performing a thermal oxidation treatment on the silicon carbide surface and further removing a thermally oxidized film to expose the anti phase boundary, the observation was performed.

TABLE 3

| Off angle (degrees) | Anti phase boundary density (cm$^{-2}$) |
|---|---|
| 0° | 8 × 10$^9$ |
| 4° | 2 × 10$^8$ |
| 10° | 1 × 10$^9$ |

From the relationship between the off angle and the anti phase boundary density shown in Table 3, the decrease of the anti phase boundary density by the off angle introduction is confirmed, but it is seen that complete elimination is not realized.

Figure 4:
FIG. 4 is a scanning electron microscope image of an SiC film surface developed on the substrate with an off angle of 4°.
Figure 5:
FIG. 5 is a scanning electron microscope image of the SiC film surface developed on the substrate with no off angle.

The scanning electron microscope image of the SiC film surface developed on the substrate with the off angle of 4° is shown in FIG. 4, and the scanning electron microscope image of the SiC film surface developed on the substrate with no off angle is shown in FIG. 5.

From FIGS. 4 and 5, the enlargement of the terrace area by the off angle introduction is confirmed and it is seen that the SiC growth in the step flow mode is dominant and that the propagation orientation of the surface defect is limited in the specified crystal surface.

EXAMPLE 1

After preparing an Si (001) surface as the substrate to grow, and thermally oxidizing the substrate surface, the photolithography technique was used to form a line and space pattern with a width of 1.5 µm, length of 60 mm, and thickness of 1 µm in a resist on the substrate surface. Additionally, the direction of the line and space pattern was set to be parallel to the [110] orientation. By using a hot plate on the conditions shown in Table 4 to heat this substrate, the line and space resist pattern was extended and deformed in the direction orthogonal to a line, and a resist pattern shape with a section having an undulatory shape was obtained in which the undulation top and bottom were connected via a smooth curve. The sectional shape (undulation) and flat shape (line and space) of this resist pattern were transferred to the Si substrate by dry etching.

Figure 6:
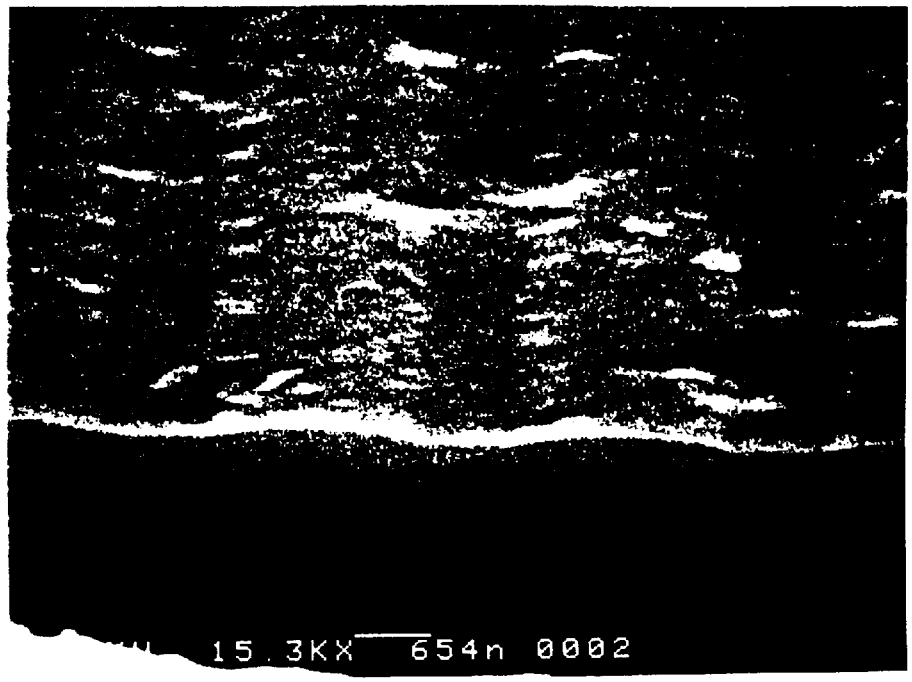
FIG. 6 is a scanning electron microscope image of the Si substrate provided with the undulation.

After removing the resist in a mixed solution of hydrogen peroxide and sulfuric acid (FIG. 6), the growing of 3C—SiC was carried out. The growing of SiC is divided to the process of carbonizing the substrate surface, and the SiC growing process by the alternate supply of the source gas. The detailed conditions of the SiC growing process are shown in Table 5. Additionally, the detailed conditions of the carbonizing process are similar to those of Table 1.

TABLE 4

| Heating temperature | 170° C. |
|---|---|
| Heating time | 10 minutes |

TABLE 5

| Growing temperature | 1050° C. |
|---|---|
| Gas supply method | Alternate supply of acetylene and dichlorosilane |
| Acetylene flow rate | 10 sccm |
| Dichlorosilane flow rate | 10 sccm |
| Gas supply interval | 5 sec |
| Gas supply time | 10 sec |
| Maximum pressure | 100 mTorr |
| Minimum pressure | 10 mTorr |
| No. of gas supply cycles | 100 to 50000 times |

When the density of the anti phase boundary appearing on the uppermost surface was measured in a similar manner as above by changing the number of source gas supply cycles to change the film thickness of SiC in the SiC growing process, results shown in. Table 6 were obtained.

TABLE 6

| Film thickness (µm) | Anti phase boundary density (cm$^{-2}$) |
|---|---|
| 0.1 | 5 × 10$^9$ |
| 0.4 | 6 × 10$^7$ |
| 1.0 | 1 × 10$^5$ |
| 1.8 | 7 × 10$^3$ |
| 2.5 | 85 |

TABLE 6-continued

| Film thickness (µm) | Anti phase boundary density (cm$^{-2}$) |
|---|---|
| 3.5 | 11 |
| 5.5 | 0 |

It is seen from the relationship between the SiC film thickness and the anti phase boundary density shown in Table 6 that when the SiC film thickness subjected to the epitaxial growth on the Si substrate having an undulation shape exceeds 2.1 µm being 1/√2 times the undulation top interval of 3.0 µm, the decrease of the anti phase boundary is remarkable, and that the effectiveness of the present invention is remarkable as compared with the numeric values of the conventional process shown in Table 3.

EXAMPLE 2

The Si (001) surface was prepared as the substrate to grow, and the photolithography technique was used to form the line and space pattern with a width of 1.5 µm, length of 60 mm, and thickness of 1 µm in the resist on the substrate surface. Additionally, the direction of the line and space pattern was set to be parallel to the [110] orientation. By using the hot plate on the conditions shown in Table 7 to heat the substrate and soften the resist, the sectional shape of the resist, pattern was changed. The sectional shape (undulation) and flat shape (line and space) of this resist pattern were transferred to the Si substrate by dry etching.

After removing the resist in the mixed solution of hydrogen peroxide and sulfuric acid, the growing of 3C—SiC was carried out. The growing of SiC is divided to the process of carbonizing the substrate surface, and the SiC growing process by the alternate supply of the source gas. Additionally, the detailed conditions of the carbonizing process were set to be similar to those of Table 1, and the detailed conditions of the SiC growing process were set to be similar to those of Table 5.

TABLE 7

| Heating temperature | 150° C. to 200° C. |
|---|---|
| Heating time | 10 minutes |

When the density of the anti phase boundary appearing on the uppermost surface was measured in a similar manner as above with respect to 3C—SiC developed on each substrate by changing the heating temperature of the resist pattern between 150° C. and 200° C. to change the undulation inclination angle θ, results shown in Table 8 were obtained.

TABLE 8

| Undulation inclination angle (degrees) | Anti phase boundary density (cm$^{-2}$) |
|---|---|
| 0° | 8 × 10$^9$ |
| 0.2° | 3 × 10$^9$ |
| 0.5° | 1 × 10$^9$ |
| 1° | 30 |
| 2° | 0 |
| 4° | 0 |
| 10° | 45 |
| 40° | 230 |
| 50° | 320 |
| 60° | 1 × 10$^4$ |
| 70° | 7 × 10$^5$ |
| 90° | 5 × 10$^9$ |

From the relationship between the undulation inclination degree and the anti phase boundary density shown in Table 8, when the undulation inclination angle θ is particularly less than the angle formed by the (111) surface of 54.7° and equal to or more than 1°, the decrease of the anti phase boundary density can be confirmed. Furthermore, as compared with the numeric values of the conventional process shown in Table 3, even with the same off angle, in the 3C—SiC developed on the undulation processes substrate as in the present invention, the anti phase boundary density remarkably decreases or disappears, and it is seen that the effectiveness of the present invention is remarkable.

EXAMPLE 3

Figure 7:
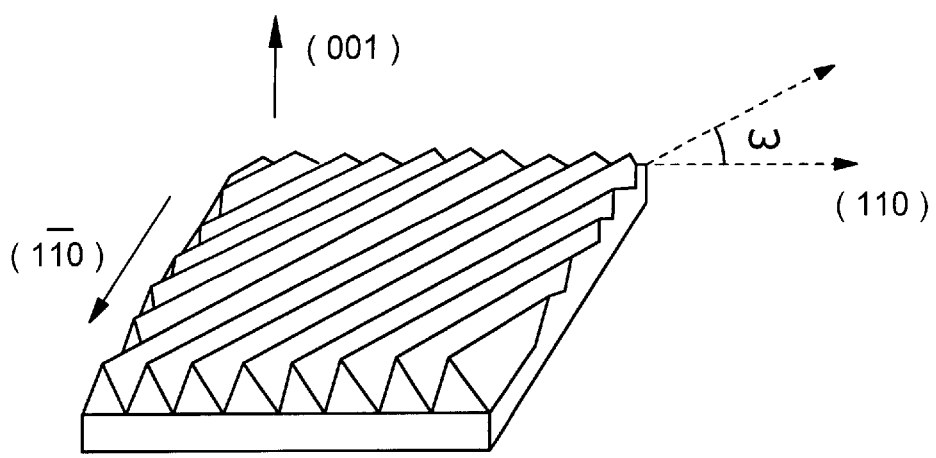
FIG. 7 is a schematic perspective view showing the Si substrate processed when the direction of an undulation pattern deviates from [110] orientation.

The Si (001) surface was prepared as the substrate to grow, and the photolithography technique was used to form the line and space pattern with a width of 1.5 μm, length of 60 mm, and thickness of 1 μm in the resist on the substrate surface. Additionally, with respect to the direction of the line and space pattern, the crossed axes angle ω of the [110] orientation and the line and space pattern direction (see FIG. 7) was changed as shown in Table 9. Thereafter, by using the hot plate on the conditions shown in Table 4 to heat the substrate and soften the resist, the sectional shape of the resist pattern was changed. The resist pattern shape was transferred to the Si substrate by dry etching.

After removing the resist in the mixed solution of hydrogen peroxide and sulfuric acid, the growing of 3C—SiC was carried out. The growing of SiC is divided to the process of carbonizing the substrate surface, and the SiC growing process by the alternate supply of the material gas. Additionally, the detailed conditions of the carbonizing process were set to be similar to those of Table 1, and the detailed conditions of the SiC growing process were set to be similar to those of Table 2.

When the density of the anti phase boundary appearing on the uppermost surface was measured in a similar manner as above with respect to the 3C—SiC developed on each substrate by changing the crossed axes angle ω, results shown in Table 9 were obtained.

TABLE 9

| Crossed axes angle (degrees) | Anti phase boundary density (cm$^{-2}$) |
| --- | --- |
| 0° | 0 |
| 15° | 12 |
| 30° | 200 |
| 45° | 850 |

From the relationship between the crossed axes angle ω and the anti phase boundary density shown in Table 9, when the direction of the line and space pattern is oriented in the [110] orientation, the decrease of the anti phase boundary density can be confirmed. Furthermore, as compared with the numeric values of the conventional process shown in Table 3, it is seen that the anti phase boundary density is remarkably decreased or eliminated, and that the effectiveness of the present invention is remarkable.

EXAMPLE 4

In the examples 1 to 3, the mask having the line and space pattern in which the line width is equal to the space width was used, the substrate having the undulation sectional pattern in which the ratios of recesses and protrusions were equal to each other was prepared, and the growing of 3C—SiC was performed on the substrate. On the other hand, in the example 4, the line and space patterns with a line width of 1.5 μm, and space widths which are twice, four times, eight times, and 16 times the line width were used as the pattern with the decreased density of protrusions to perform a substrate processing, and the growing of 3C—SiC was performed on the substrate. Both the substrate processing conditions and the SiC growing conditions are the same as those of the example 3. Additionally, the undulation inclination angle was set to 4°.

When the anti phase boundary density was measured similarly to the above with respect to the patterns by changing the density of undulation recesses, results shown in Table 10 were obtained. Additionally, as comparative examples, the anti phase boundary density with the use of the pattern having a line width and a space width both of 1.5 μm, and the anti phase boundary density with the use of the Si (001) substrate (off angle 0°) with no undulation in which the line width is extended to infinity (∞) and supposedly to the limit were similarly measured as shown in Table 10.

TABLE 10

| Ratio of space width/line width | Anti phase boundary density (cm$^{-2}$) |
| --- | --- |
| 1 | 0 |
| 2 | 12 |
| 4 | 165 |
| 8 | 890 |
| 16 | $2 \times 10^4$ |
| ∞ | $8 \times 10^9$ |

From Table 10, when the undulation protrusion interval increases, and the undulation density decreases, the increase of the anti phase boundary density can be confirmed. Furthermore, as compared with the numeric values of the conventional process of Table 3, it is seen that the anti phase boundary density is remarkably decreased or eliminated, and that the effectiveness of the present invention is remarkable.

EXAMPLE 5

Figure 1:
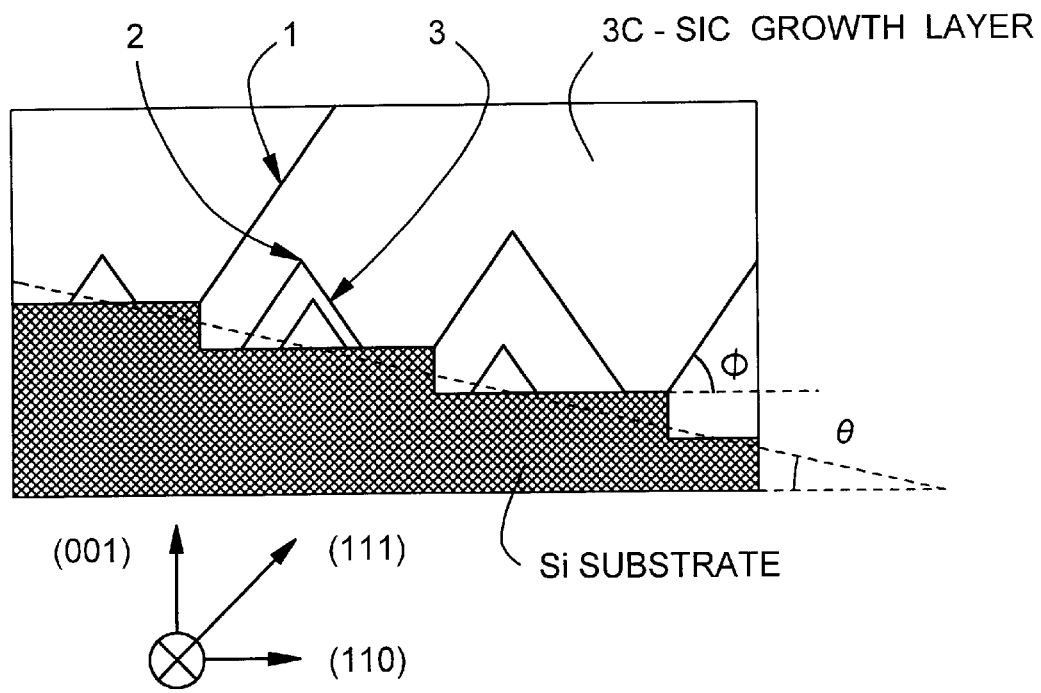
FIG. 1 is a schematic sectional view showing the generation or extinction of anti phase boundaries with the growth of 3C—SiC onto an Si substrate to which an off angle is applied.
Figure 2:
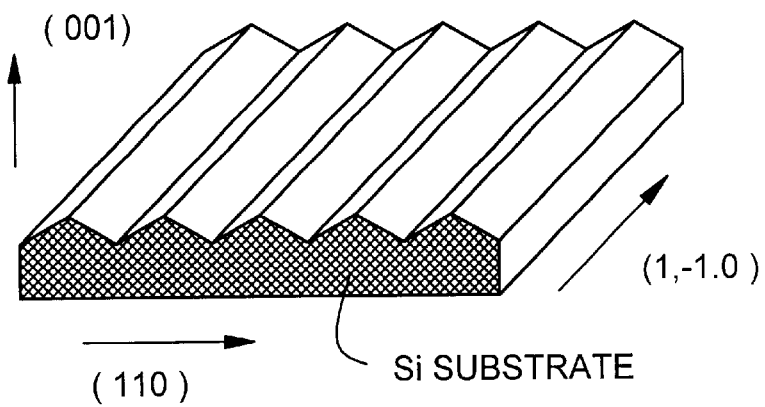
FIG. 2 is a perspective view showing a single crystal Si (001) surface substrate provided with an undulation parallel to [1, −1, 0] orientation.
Figure 3:
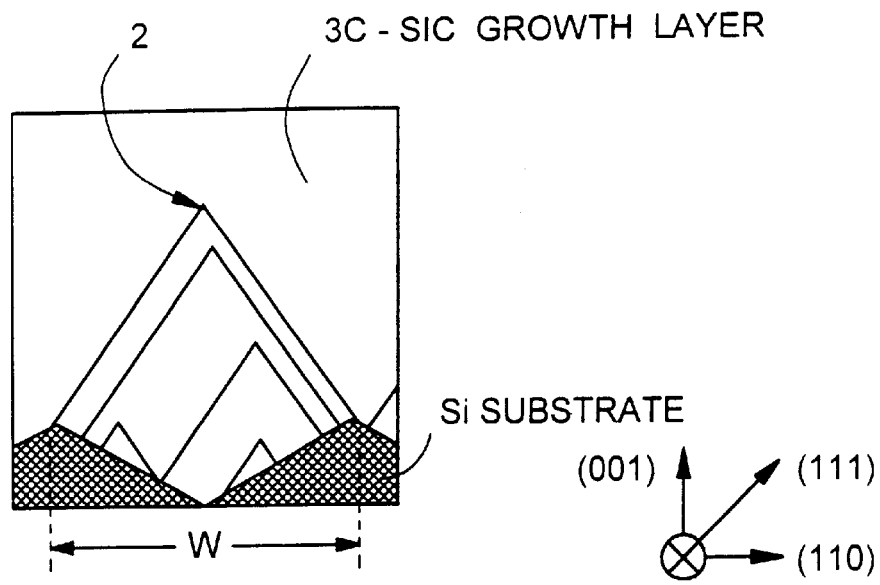
FIG. 3 is a schematic sectional view showing the extinction of the anti phase boundaries with the growth of 3C—SiC onto the Si (001) surface substrate provided with the undulation.

In the examples 1 to 4 only the undulatory structure of the substrate section has been described. It is apparent also from the description of FIG. 3 that the effectiveness of the present invention can also be held with respect to the structure other than the undulatory type. Actually, the undulation processing with the saw blade shaped section was applied to the Si (001) surface in the following method, and the growing of 3C—SiC was performed on the substrate.

Figure 8:
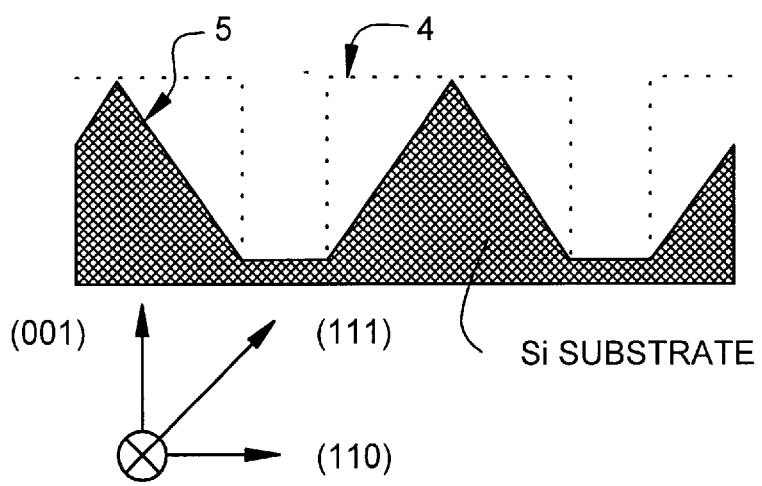
FIG. 8 is a schematic sectional view showing the Si substrate surface provided with a saw blade shaped undulation.

Specifically, the Si (001) surface was prepared as the substrate to grow, and the photolithography technique was used to form the line and space pattern with a width of 1.5 μm, length of 60 mm, and thickness of 1 μm in the resist on the substrate surface. Additionally, the direction of the line and space pattern was set to be parallel to the [110] orientation. The resist pattern shape was transferred to the Si substrate by dry etching. After removing the resist in the mixed solution of hydrogen peroxide and sulfuric acid, the substrate was immersed in KOH aqueous solution to perform wet etching. The conditions of wet etching are shown in Table 11. As a result of the wet etching, the single crystal Si (001) surface having the saw blade shaped undulation with an inclination angle of 1°, 10°, 55° was obtained (see FIG. 8). Additionally, in FIG. 8, numeral 4 denotes the substrate sectional structure before the wet etching, and 5 denotes the saw blade shaped substrate sectional structure after the wet etching.

TABLE 11

| Etching solution | KOH aqueous solution |
|---|---|
| Solution density | 15 mol/cc |
| Temperature | 60° C. |
| Time | 5 minutes, 10 minutes, 20 minutes |

The growing of 3C—SiC was carried out on the above-described substrate. The growing of SiC is divided to the process of carbonizing the substrate surface, and the SiC growing process by the alternate supply of the source gas. Additionally, the detailed conditions of the carbonizing process were set to be similar to those of Table 1, and the detailed conditions of the SiC growing process were set to be similar to those of Table 2.

When the density of the anti phase boundary appearing on the uppermost surface was measured in a similar manner as above with respect to SiC developed on each substrate, results shown in Table 12 were obtained.

TABLE 12

| Undulation inclination angle (degrees) | Anti phase boundary density $(cm^{-2})$ |
|---|---|
| 1° | 140 |
| 10° | 30 |
| 55° | 420 |

It is seen from Table 12 that even when the substrate section has a saw blade shaped undulation structure, the present invention has an effectiveness. Moreover, this substrate preparing method is suitable in fulfilling the effectiveness of the present invention.

EXAMPLE 6

In each of the examples 1 to 5 the cubic silicon carbide film was developed on the Si (001) surface substrate. In the example 6, as the substrate to grow, a substrate provided with the undulation extended in parallel with the [110] orientation on the (001) surface of the single-crystal cubic silicon carbide (single crystal 3C— SiC), and a substrate provided with the undulation extended in parallel with the [0, 0, 0, 1] orientation on the (1, 1, −2, 0) surface of the single-crystal hexagonal silicon carbide were used, and the growing of the cubic silicon carbide film or the hexagonal silicon carbide film was performed on each substrate surface.

As a result, the effectiveness of the present invention was confirmed similarly to the examples 1 to 5.

EXAMPLE 7

In each of the examples 1 to 6 the method of using the lithography technique to etch the Si substrate (001) surface is employed as the method of preparing the undulation, but the method of preparing the undulation on the surface of the substrate to grow can be performed in the technique other than etching to bring about the effectiveness of the present invention. One example will be described in the example 7.

Figure 9:
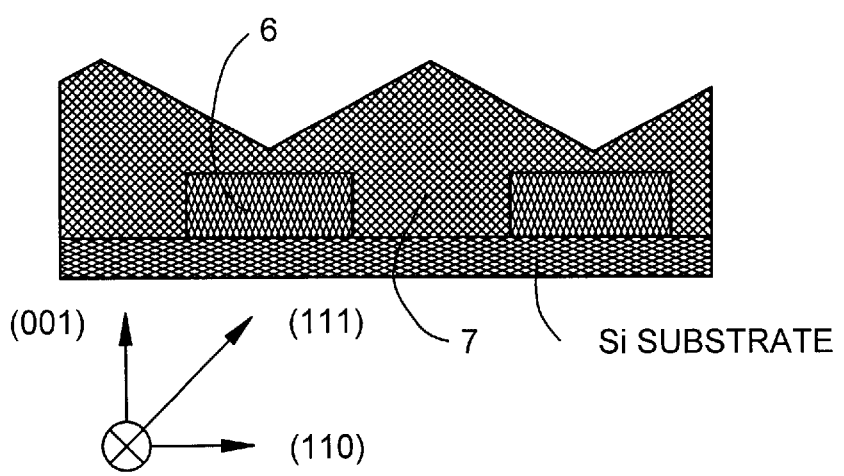
FIG. 9 is a schematic sectional view showing a method of preparing the undulation in a process other than etching.

By using the Si (001) surface as the substrate, and thermally oxidizing the surface, an Si oxidized film ($SiO_2$ film) of 3000 angstroms was formed. Subsequently, the photolithography technique was used to form the line and space pattern with a width of 1.5 $\mu$m, length of 60 mm, and thickness of 1 $\mu$m in the resist on the thermally oxidized film. Additionally, the direction of the line and space pattern was set to be parallel to the [110] orientation. The resist pattern shape was transferred to the thermally oxidized film by dry etching, and the $SiO_2$ pattern and Si exposed portion were arranged in a stripe shape. After removing the resist in the mixed solution of hydrogen peroxide and sulfuric acid, the selective homo-epitaxial growth of Si was carried out on this substrate as shown in FIG. 9. The detailed conditions of the SiC growing process are shown in Table 13. Additionally, in FIG. 9, numeral 6 shows the striped $SiO_2$ pattern, and 7 shows the Si layer resulting from the selective homo-epitaxial growth.

TABLE 13

| Growing temperature | 1000° C. |
|---|---|
| Hydrogen flow rate | 50 sccm |
| Dichlorosilane flow rate | 10 sccm |
| Maximum pressure | 100 mTorr |

As a result of the Si growth, the single crystal Si (001) surface provided with the undulation of the inclination angle 55° was obtained. The growing of 3C—SiC was performed on this substrate surface, and it was confirmed that the anti phase boundary density remarkably decreased.

EXAMPLE 8

In the example 8, it was tried to prepare the substrate with the undulation parallel to the [110] direction formed thereon in a method of performing an abrasion processing on the Si (100) substrate surface in parallel with the [110] direction. In the abrasion, a commercial diamond slurry with a diameter of about 15 $\mu$m$\phi$(manufactured by Engis Co.: High Press) and a commercial abrasion pad (manufactured by Engis Co.: M414) were used.

By allowing the diamond slurry to uniformly permeate on the pad, placing the Si (100) substrate on the pad, applying a pressure of 0.1 to 0.2 kg/cm² to the entire Si (100) substrate, and reciprocating the substrate 300 times for a distance of about 20 mm on the pad in parallel with the [110] orientation, the one-direction abrasion processing was performed. An infinite number of abrasion scratches were formed in parallel with the [110] direction on the Si (100) substrate surface.

Since the abrasive grains, and the like adhered to the Si (100) substrate surface subjected to the one-direction abrasion processing, the substrate surface was washed in an $NH_4OH+H_2O_2+H_2O$ mixed solution (at a ratio of $NH_4OH:H_2O_2:H_2O=4:4:1$ and a solution temperature of 60° C.), alternately immersed and washed in an $H_2SO_4+H_2O_2$ solution (at a ratio of $H_2SO_4:H_2O_2=1:1$ and a solution temperature of 80° C.) and in an HF (10%) solution three times each, and finally rinsed with de-ionized water.

After washing, a thermally oxidized film was formed in a thickness of about 5000 angstroms on the one-direction abrasion processed substrate. The thermally oxidized film was removed by the HF 10% solution. When only the abrasion is performed, there are a large number of fine recesses/protrusions and defects in addition to scratches on the substrate surface, and the substrate cannot be used as the substrate to grow. However, by once forming the thermally oxidized film, and removing the thermally oxidized film anew, the fine recesses/protrusions of the substrate surface were removed, and a very smooth undulation surface could be obtained. When the undulatory section is observed, the magnitude of the undulatory recess/protrusion is unstable and irregular, but the density is high. At least a horizontal surface does not exist. The surface is constantly in an undulation state. On average, the groove depth was in a range of 30 to 50 nm, and the width was in a range of about 0.5 to 1.5 µm. The inclination degree was in a range of 3 to 5 degrees.

This substrate was used to form the SiC film on the substrate. As a result, the effect of the substrate with the undulation parallel to [110] formed thereon could be obtained. Specifically, the defects of the anti phase boundary remarkably decrease.

For example, the anti phase boundary density of the SiC film developed on the non-abraded Si substrate is $8 \times 10^9$ boundaries/cm$^2$, while the anti phase boundary defect density of the SiC film developed on the Si substrate subjected to this one-direction abrasion is 0 to 1 defect/cm$^2$. The undulation shape and anti phase boundary defect density with respect to the abrasive grain size are as shown in Table 14. Moreover, the undulation density and anti phase boundary defect density with respect to the number of abrasions are as shown in Tables 15.

TABLE 14

| Abrasive grain size (µmφ) | Depth/width (between protrusions) (nm) | Inclination degree (degrees) | Anti phase boundary density (cm$^{-2}$) |
|---|---|---|---|
| 3 | 7/500 | 1 | 30 |
| 9 | 10/500 | 2 | 0 |
| 15 | 35/1000 | 4 | 0 |

(The conditions described in the example 8 were used and only the abrasive grain size was changed.)

TABLE 15

| No. of abrasion/ reciprocation (times) | Undulation density (%) | Anti phase boundary density (cm$^{-2}$) |
|---|---|---|
| 50 | 50 | 100 |
| 100 | 80 | 20 |
| 300 | 100 | 0 |

(The conditions described in the example 8 were used and only the number of reciprocation was changed.)

Additionally, in the example 8, the diamond slurry with a size of 15 µmφ was used as the abrasive, but the abrasive grain size and type are not limited. Moreover, the pad is not limited to the above. Furthermore, the load pressure between the substrate and the pad during abrasion, the abrasion speed and times, and the like are not limited to the above. Moreover, Si (100) was used in the example 8, but even when the cubic SiC, or hexagonal SiC is used, needless to say, the results similar to the above-described results can be obtained.

The examples have been illustrated to describe the present invention, but the present invention is not limited to the above-described examples.

For example, the film formation conditions, thickness, and the like of the silicon carbide film are not limited to those of the examples.

Moreover, for example, the single crystal substrates such as silicon carbide and sapphire can be used as the substrate to grow.

As the source gas of silicon, dichlorosilane ($SiH_2Cl_2$) was used, but silane compound gases such as $SiH_4$, $SiCl_4$, and $SiHCl_3$ can be used. Moreover, as the source gas of carbon, acetylene ($C_2H_2$) was used, but hydrocarbon gases such as $CH_4$, $C_2H_6$, and $C_3H_8$ can be used.

Additionally, the epitaxial growth process of silicon carbide is not limited as long as the propagation orientation of the film inner surface defect can be limited in the specified crystal surface, and in addition to a gas phase chemical deposition (CVD) process, a liquid phase epitaxial growth process, a sputtering process, a molecular beam epitaxy (MBE) process, and the like can be used. Moreover, in the CVD process, instead of the alternate supply process of the material gas, a simultaneous supply process of material gas can be used.

For the silicon carbide film formed on the substrate to grow by the above-described method of the present invention, by joining the silicon carbide film surface to an insulator, removing the substrate to grow, then removing the defective layer of the silicon carbide film (a part having an anti phase boundary density on the side of the substrate to grow), a semiconductor-on-insulator (SOI) structure can be obtained in which a semiconductor thin film is formed on the insulator.

Here, the joining of the silicon carbide film and the insulator can be performed by methods such as anodic bonding, bonding by a low melting glass, direct bonding, and bonding by an adhesive. The anodic bonding method comprises placing a glass containing an electric charge movable ion (e.g., silicate glass, borosilicate glass, borate glass, aluminosilicate glass, phosphate glass, fluorophosphate glass, and the like) in contact with the silicon carbide film, and applying an electric field to perform the bonding. In this case, the bonding temperature is in a range of 200 to 300° C., the applied voltage is in a range of 500 to 1000 V, and the load is in a range of about 500 to 1000 g/cm$^2$. The bonding method by the low melting glass comprises depositing the low melting glass on the silicon carbide film surface by the sputtering process or the like, applying a load and heat, and bonding the glasses to each other. The direct bonding method comprises contacting and connecting the silicon carbide film directly to the glass by an electrostatic force, and subsequently applying the load and heat to strengthen the connection in the interface.

The substrate to grow can be removed, for example, by wet etching. For example, the silicon substrate is removed by immersing the substrate in a mixed acid of HF and $HNO_3$ ($HF:HNO_3=7:1$).

The defective layer is removed for the purpose of removing the defective layer in which the anti phase boundaries exist with a high density in the vicinity of the substrate interface of the silicon carbide film. The defective layer can be removed, for example, by dry etching. For example, by using $CF_4$ (40 sccm) or $O_2$ (10 sccm) as an etching gas, and performing a reactive ion etching at RF power of 300 W.

The SOI structure unit (substrate) is applied, for example, to a semiconductor substrate, a transparent conductive film in the substrate for TFT liquid crystal, a dielectric layer for a Kerr effect in an optical magnetic recording medium, a micro machine, various sensors (pressure sensor, and the like), an X-ray penetrable film, and the like.

As described above, according to the method of manufacturing silicon carbide of the present invention, the silicon carbide film can be obtained in which the anti phase boundaries are effectively reduced or eliminated.

Moreover, since the crystal boundary density is small, the silicon carbide film of the present invention has a very superior electric property, and can extensively be used as various electronic elements, and the like.

What is claimed is:

1. A method for manufacturing a silicon carbide film in which a crystal orientation is inherited on a single crystal substrate surface and silicon carbide is allowed to epitaxially grow, the method comprising the steps of:

entirely or partially providing said substrate surface with a plurality of undulations extended parallel in one direction, each of said undulations being formed in a manner such that inclined surfaces thereof with an angle smaller than 90° relative to a basal plane are opposed to each other and an integral value of the angles of inclined surfaces is substantially 0°; and allowing the silicon carbide to grow on the substrate surface.

2. The method for manufacturing the silicon carbide film according to claim 1 wherein the silicon carbide is grown in a manner such that surface defects caused in the silicon carbide film can be limited to propogate towards specific crystal surface orientations.

3. The method for manufacturing the silicon carbide film according to claim 1 wherein when an average value of an interval between undulation tops of said substrate surface to set to W, the silicon carbide film has thickness of $W/\sqrt{2}[(=2^{1/2})]$ or more.

4. The method for manufacturing the silicon carbide film according to claim 1 wherein the interval between the undulation tops of said substrate surface is in a range of 0.01 μm to 10 μm, an undulation height difference is in a range of 0.01 μm to 20 μm, and an inclination degree of an inclined surface in the undulation is in a range of 1° to 55°.

5. The method for manufacturing the silicon carbide film according to claim 1 in which a crystal orientation is inherited on a single crystal substrate surface and silicon carbide is allowed to epitaxially grow, the method for manufacturing the silicon carbide film comprising steps of:

entirely or partially providing said substrate surface with a plurality of undulations extended parallel in one direction; and allowing silicon carbide to grow on the substrate surface, wherein said substrate comprises a single crystal 3C—SiC, the substrate surface comprises a (001) surface, and the surface is provided with the undulation extended in parallel with a [110] orientation.

6. The method for manufacturing the silicon carbide film according to claim 1 in which a crystal orientation is inherited on a single crystal substrate surface and silicon carbide is allowed to epitaxially grow, the method for manufacturing the silicon carbide film comprising steps of:

entirely or partially providing said substrate surface with a plurality of undulations extended parallel in one direction; and allowing silicon carbide to grow on the substrate surface, wherein said substrate comprises a hexagonal single crystal SiC, the substrate surface comprises a (1, 1, −2, 0) surface, and the surface is provided with the undulation extended in parallel with a [1, −1, 0, 0] orientation or a [0, 0, 0, 1] orientation.

7. A silicon carbide film manufactured using the method according to claim 1.

8. A method for manufacturing a silicon carbide film in which a crystal orientation is inherited on a single crystal substrate surface and silicon carbide is allowed to epitaxially grow, the method for manufacturing the silicon carbide film comprising steps of:

entirely or partially providing said substrate surface with a plurality of undulations extended parallel in one direction; and allowing silicon carbide to grow on the substrate surface, wherein said substrate comprises a single crystal Si, the substrate surface comprises a (001) surface, and the surface is provided with the undulation extended in parallel with a [110] orientation.

9. A method for manufacturing a silicon carbide in which a crystal orientation is inherited on a single crystal substrate surface and silicon carbide is allowed to epitaxially grow, the method comprising the steps of:

entirely or partially providing said substrate with a plurality of undulations extended parallel in one direction, each of said undulations being formed in a manner such that crests and troughs thereof repeatedly appear when viewed from a direction where said undulations extend in parallel, each crest has an inclined surface with a predetermined angle relative to a basal plane, and the inclined surfaces forming adjacent crests are opposed to each other with disposing the trough therebetween; and allowing the silicon carbide to grow on the substrate surface.

* * * * *